United States Patent
Taoka

(10) Patent No.: US 12,341,500 B2
(45) Date of Patent: Jun. 24, 2025

(54) DRIVE DEVICE FOR VOLTAGE-CONTROLLED SEMICONDUCTOR ELEMENT

(71) Applicant: FUJI ELECTRIC CO., LTD., Kawasaki (JP)

(72) Inventor: Masahiro Taoka, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 392 days.

(21) Appl. No.: 18/080,374

(22) Filed: Dec. 13, 2022

(65) Prior Publication Data

US 2023/0112315 A1 Apr. 13, 2023

Related U.S. Application Data

(63) Continuation of application No. PCT/JP2021/040994, filed on Nov. 8, 2021.

(30) Foreign Application Priority Data

Dec. 11, 2020 (JP) ................................. 2020-206307

(51) Int. Cl.
*H03K 17/082* (2006.01)
*H02H 1/00* (2006.01)

(52) U.S. Cl.
CPC ......... *H03K 17/082* (2013.01); *H02H 1/0007* (2013.01)

(58) Field of Classification Search
CPC .... H03K 17/082; H03K 17/162; H03K 17/28; H03K 17/0828; H03K 17/168;
(Continued)

(56) References Cited

U.S. PATENT DOCUMENTS 7,933,105 B2 * 4/2011 Yamawaki ........... H03K 17/168
361/93.7
8,674,728 B2 * 3/2014 Sogo .................. H03K 17/0828
327/108
(Continued)

FOREIGN PATENT DOCUMENTS

EP 3852259 A1 7/2021
JP H01196913 A 8/1989
(Continued)

OTHER PUBLICATIONS

International Search Report for PCT/JP2021/040994, mailed on Dec. 7, 2021.
Written Opinion for PCT/JP2021/040994, mailed on Dec. 7, 2021.

*Primary Examiner* — Dharti H Patel
(74) *Attorney, Agent, or Firm* — Rabin & Berdo, P.C.

(57) ABSTRACT

A drive device for a voltage-controlled semiconductor element. The drive device includes: a short-circuit current detection circuit which detects a short-circuit current flowing through the voltage-controlled semiconductor element; a timer circuit which outputs a time setting signal indicative of a determined time, responsive to the short-circuit current detection circuit detecting the short-circuit current; and a control power source voltage variable circuit which receives a power supply voltage applied to the drive device, decreases the power supply voltage for a period for which the control power source voltage variable circuit receives the time setting signal from the timer circuit, to thereby obtain a stepped-down voltage, and outputs the stepped-down voltage as a control power source voltage.

6 Claims, 2 Drawing Sheets

(58) Field of Classification Search
CPC ...... H02H 1/0007; H02H 3/093; H02H 9/025; H02M 1/00
USPC ........................................................ 361/93.1
See application file for complete search history.

(56) References Cited

U.S. PATENT DOCUMENTS

| | | | |
|---|---|---|---|
| 11,683,030 B2* | 6/2023 | Thalheim | H03K 17/0822 |
| | | | 361/86 |
| 2012/0249020 A1* | 10/2012 | Komatsu | H02M 1/32 |
| | | | 327/109 |
| 2014/0192449 A1* | 7/2014 | Shimizu | H02M 1/36 |
| | | | 361/93.1 |
| 2015/0311692 A1* | 10/2015 | Hiyama | H02M 1/08 |
| | | | 361/31 |
| 2015/0340355 A1* | 11/2015 | Zhang | H02H 3/20 |
| | | | 361/86 |
| 2016/0126718 A1* | 5/2016 | Naito | H02H 3/025 |
| | | | 361/101 |
| 2017/0063074 A1 | 3/2017 | Yasusaka et al. | |
| 2017/0288385 A1* | 10/2017 | Naka | H03K 17/0822 |
| 2018/0154787 A1 | 6/2018 | Chen et al. | |
| 2019/0097533 A1* | 3/2019 | Kawata | H05B 47/25 |
| 2021/0249958 A1* | 8/2021 | Ida | H03K 19/20 |
| 2021/0320608 A1 | 10/2021 | Furukawa et al. | |
| 2023/0086132 A1* | 3/2023 | Miyazaki | H02M 1/0009 |
| | | | 361/101 |

FOREIGN PATENT DOCUMENTS

| | | | | |
|---|---|---|---|---|
| JP | 2005020843 A | | 1/2005 | |
| JP | 2017046570 A | | 3/2017 | |
| JP | 2018057105 A | | 4/2018 | |
| WO | WO-2006006407 A1 * | 1/2006 | ............ | H02M 1/32 |
| WO | 2016038717 A1 | | 3/2016 | |
| WO | 2016117459 A1 | | 7/2016 | |
| WO | 2020054202 A1 | | 3/2020 | |

* cited by examiner

DRIVE DEVICE FOR VOLTAGE-CONTROLLED SEMICONDUCTOR ELEMENT

CROSS-REFERENCE TO RELATED APPLICATION

This application is a continuation application of International Application PCT/JP2021/040994 filed on Nov. 8, 2021, which designated the U.S., which claims priority to Japanese Patent Application No. 2020-206307, filed on Dec. 11, 2020, the entire contents of which are incorporated herein by reference.

BACKGROUND OF THE INVENTION

1. Field of the Invention

The embodiment discussed herein relates to a drive device for a voltage-controlled semiconductor element.

2. Background of the Related Art

Usually, an inverter unit applied to, for example, a variable speed unit of a motor includes a power element for power conversion, a drive circuit which controls and drives the power element, a protection circuit, and a control circuit which totally controls these components. Excluding the control circuit, the power element, the drive circuit, and the protection circuit are collected into one package. By doing so, a semiconductor device referred to as an intelligent power module (hereinafter referred to as an IPM) is commercialized.

A voltage-controlled semiconductor element, such as an insulated gate bipolar transistor (IGBT) or a metal-oxide-semiconductor field-effect transistor (MOSFET), is used as the power element.

Usually, an IPM includes a short-circuit protection circuit. The short-circuit protection circuit monitors a current flowing through a power element. When a short-circuit current flows through the power element, the short-circuit protection circuit protects the power element so that the power element will not break.

A technique for limiting, at the time of detecting a short-circuit current flowing through a power element, the short-circuit current by decreasing a gate voltage is known as the short-circuit protection circuit (see, for example, Japanese Laid-open Patent Publication No. 2005-20843). With the technique disclosed in, for example, Japanese Laid-open Patent Publication No. 2005-20843, when a short-circuit current is detected, short-circuit detection is canceled only during a determined period just after an input of an operation start command. By doing so, the occurrence of short-circuit erroneous detection is prevented.

Furthermore, the following short-circuit protection circuit is also known (see, for example, International Publication Pamphlet No. WO 2016/038717). When a short-circuit current flowing through a power element is detected, a gate voltage is decreased. After the short-circuit protection circuit makes sure that a circuit which detects the short-circuit current by detecting a current running through a gate wiring as a result of a decrease in the gate voltage is in an operating state, the short-circuit protection circuit changes a driving voltage so that the power element is turned off. As a gate wiring from a drive circuit to a gate of the power element becomes longer, the high-frequency impedance of the wiring increases. As a result, a high-frequency noise current is less likely to flow. The short-circuit protection circuit prevents erroneous operation of the drive circuit at the time of short-circuit detection caused by noise.

A short circuit is detected and a protection circuit operates. When a short-circuit protection circuit decreases a gate voltage of a power element to perform a current shutdown, the short-circuit protection circuit gradually decreases the gate voltage. When noise appears before a gate shutdown is completed, the short-circuit protection circuit may temporarily increase the gate voltage and turn on the power element again. Conversely, if gate shutdown capability is high and a large current is shut off, the short-circuit protection circuit may decrease a gate voltage to a voltage lower than a prescribed gate voltage at which the protection circuit operates. As a result, an erroneous shutdown occurs. The short-circuit protection circuit may turn on the power element again after the erroneous shutdown. In this case, the power element repeats an erroneous shutdown at a high speed. This leads to continuation of an excessive surge voltage.

SUMMARY OF THE INVENTION

According to an aspect, there is provided a drive device for a voltage-controlled semiconductor element. The drive device includes: a short-circuit current detection circuit which detects a short-circuit current flowing through the voltage-controlled semiconductor element; a timer circuit which outputs a time setting signal indicative of a determined time, responsive to the short-circuit current detection circuit detecting the short-circuit current; and a control power source voltage variable circuit which receives a power supply voltage applied to the drive device, decreases the power supply voltage for a period for which the control power source voltage variable circuit receives the time setting signal from the timer circuit, to thereby obtain a stepped-down voltage, and outputs the stepped-down voltage as a control power source voltage.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

An embodiment will now be described in detail by reference to the accompanying drawing with an IPM in which an IGBT is used as a voltage-controlled semiconductor element as an example. In the following description, the same numeral may be used for indicating the name of a terminal and a voltage, a signal, or the like at the terminal.

Figure 1:
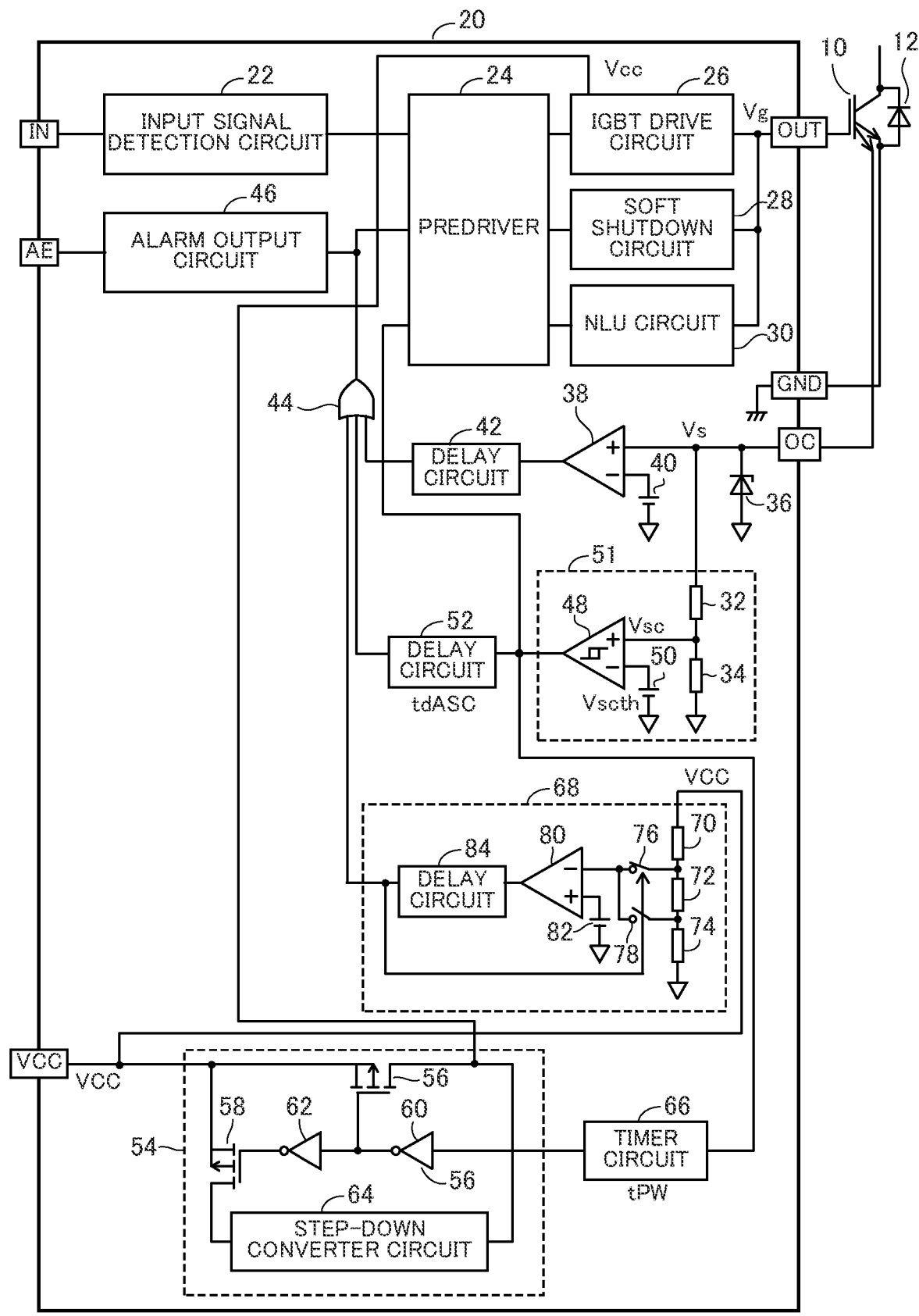
FIG. 1 illustrates an example of a drive device for a voltage-controlled semiconductor element according to an embodiment.
Figure 2:
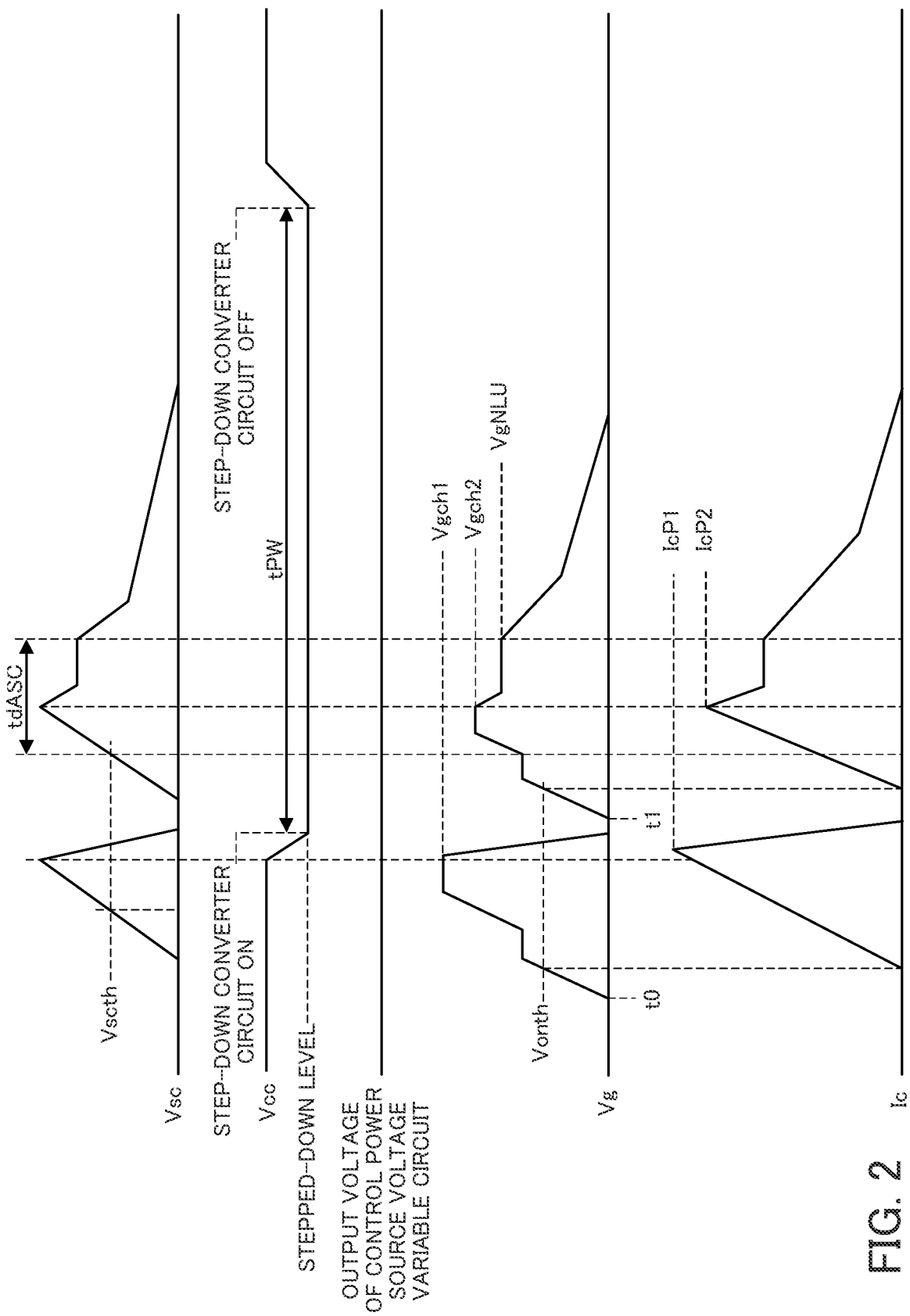
FIG. 2 illustrates fragmentary waveforms indicative of the operation of the drive device for the voltage-controlled semiconductor element.

FIG. 1 illustrates an example of a drive device for a voltage-controlled semiconductor element according to an embodiment. FIG. 2 illustrates fragmentary waveforms indicative of the operation of the drive device for the voltage-controlled semiconductor element.

FIG. 1 illustrates an IGBT 10 which is a voltage-controlled semiconductor element and a control integrated circuit (IC) 20 which is a drive device for driving the IGBT 10. The IGBT 10 and the control IC 20 make up an IPM.

The IGBT 10 is a combination of a main IGBT through which a principal current flows and a sense IGBT which shunts the principal current of the main IGBT to output about one ten-thousandth of the principal current. The structure of the sense IGBT is the same as that of the main IGBT and the size of the sense IGBT is smaller than that of the main IGBT. A gate and a collector are shared between the main IGBT and the sense IGBT. A sense emitter of the sense IGBT is independent of an emitter of the main IGBT. Furthermore, a free wheeling diode (FWD) 12 is connected to the collector and the emitter of the IGBT 10 in inverse parallel with the IGBT 10. That is to say, an anode of the FWD 12 is connected to the emitter of the IGBT 10 and a cathode of the FWD 12 is connected to the collector of the IGBT 10.

The control IC 20 has an IN terminal which receives an input signal for turning on or off the IGBT 10, an AE terminal which outputs an alarm signal, a VCC terminal which receives a power supply voltage VCC, an OUT terminal which outputs a gate voltage Vg for driving the IGBT 10, and an OC terminal which inputs a sense current. Furthermore, the control IC 20 has a GND terminal at a ground potential and the emitter of the IGBT 10 is connected to the GND terminal.

The control IC 20 includes an input signal detection circuit 22 which detects and outputs an input signal. An input of the input signal detection circuit 22 is connected to the IN terminal and an output of the input signal detection circuit 22 is connected to a first input of a predriver 24.

An output of the predriver 24 is connected to an input of an IGBT drive circuit 26, an input of a soft shutdown circuit 28, and an input of a non-latch-up (hereinafter referred to as an NLU) circuit 30. An output of the IGBT drive circuit 26, an output of the soft shutdown circuit 28, and an output of the NLU circuit 30 are connected to the OUT terminal. The OUT terminal is connected to a gate of the IGBT 10.

On the basis of a signal received from the input signal detection circuit 22, the IGBT drive circuit 26 outputs a gate voltage Vg for on-driving or off-driving the IGBT 10. That is to say, when the IGBT drive circuit 26 on-drives the IGBT 10, the IGBT drive circuit 26 outputs a source current for charging a gate capacitor of the IGBT 10. When the IGBT drive circuit 26 off-drives (shuts down) the IGBT 10, the IGBT drive circuit 26 outputs a gate voltage Vg which is such that electric charges stored in the gate capacitor of the IGBT 10 are extracted. Electric charges stored in the gate capacitor are extracted on the basis of two-stage extracting capability. Just after an off-drive signal is received, electric charges stored in the gate capacitor are extracted by utilizing small extracting capability. Electric charges stored in the gate capacitor are extracted by utilizing 100-percent extracting capability after the elapse of a determined period.

If an overcurrent state of the IGBT 10 continues for a period longer than a determined period, then the soft shutdown circuit 28 outputs a gate voltage Vg which is such that the IGBT 10 is gradually shut down by utilizing extracting capability smaller than extracting capability utilized just after a shutdown by the IGBT drive circuit 26.

If a short circuit of the IGBT 10 is detected, then the NLU circuit 30 outputs a gate voltage Vg which is such that a short-circuit current is restrained. If a restraint current continues for a period longer than a determined period, then the NLU circuit 30 outputs a gate voltage Vg which is such that the IGBT 10 is shut down.

The OC terminal of the control IC 20 is connected to the sense emitter of the IGBT 10. Furthermore, the OC terminal is connected to one terminal of a sense resistor 32. The other terminal of the sense resistor 32 is connected to one terminal of a sense resistor 34 and the other terminal of the sense resistor 34 is connected to ground. In addition, the OC terminal is connected to a cathode of a Zener diode 36 and an anode of the Zener diode 36 is connected to the ground.

The sense resistors 32 and 34 convert a sense current inputted to the OC terminal to a sense voltage Vs by passing it, and make up a voltage division circuit which divides the sense voltage Vs. The Zener diode 36 protects the sense voltage Vs against an abnormal increase caused by noise mixing or the like.

The one terminal of the sense resistor 32 is connected to a non-inverting input terminal of an overcurrent detection comparator 38 and an inverting input terminal of the overcurrent detection comparator 38 is connected to a positive electrode terminal of a reference voltage source 40. A negative electrode terminal of the reference voltage source 40 is connected to the ground. An output terminal of the overcurrent detection comparator 38 is connected to a delay circuit 42.

The overcurrent detection comparator 38 compares the sense voltage Vs with a voltage of the reference voltage source 40 corresponding to an overcurrent detection threshold. If the sense voltage Vs exceeds the overcurrent detection threshold, the overcurrent detection comparator 38 determines that an overcurrent is detected, and outputs a high (H)-level overcurrent detection signal. The overcurrent detection signal is inputted to the delay circuit 42 and is delayed for a determined time.

An output of the delay circuit 42 is connected to a first input of an OR circuit 44 and an output of the OR circuit 44 is connected to a second input of the predriver 24 and an input of an alarm output circuit 46. An output of the alarm output circuit 46 is connected to the AE terminal.

A common connection point of the sense resistors 32 and 34 is connected to a non-inverting input terminal of a short-circuit detection comparator 48 and an inverting input terminal of the short-circuit detection comparator 48 is connected to a positive electrode terminal of a reference voltage source 50. A negative electrode terminal of the reference voltage source 50 is connected to the ground. An output terminal of the short-circuit detection comparator 48 is connected to a delay circuit 52 and a third input of the predriver 24.

The short-circuit detection comparator 48 compares a divided voltage Vsc of the sense voltage Vs with a voltage of the reference voltage source 50 corresponding to a short-circuit detection threshold Vscth. If the divided voltage Vsc of the sense voltage Vs exceeds the short-circuit detection threshold Vscth, then the short-circuit detection comparator 48 determines that a short-circuit current is detected, and outputs a high (H)-level short-circuit current detection signal. The short-circuit current detection signal is inputted to the third input of the predriver 24. Furthermore, the short-circuit current detection signal is inputted to the delay circuit 52 and is delayed for a determined delay time tdASC. An output of the delay circuit 52 is connected to a second input of the OR circuit 44. The voltage division circuit made up of the sense resistors 32 and 34 for overcurrent detection, the short-circuit detection comparator 48, and the reference voltage source 50 make up a short-circuit current detection circuit 51.

In addition, the control IC 20 includes a control power source voltage variable circuit 54 which may change a control power source voltage inside the control IC 20. The control power source voltage variable circuit 54 includes MOSFETs 56 and 58, each of which is a switching element, inverter circuits 60 and 62, and a step-down converter circuit 64.

Sources of the MOSFETs 56 and 58 are connected to the VCC terminal. A drain of the MOSFET 56 is connected to an output of the control power source voltage variable circuit 54. A drain of the MOSFET 58 is connected to an input of the step-down converter circuit 64. An output of the step-down converter circuit 64 is connected to the output of the control power source voltage variable circuit 54. An input of the inverter circuit 60 is connected to an output of a timer circuit 66 and an input of the timer circuit 66 is connected to the output of the short-circuit detection comparator 48. An output of the inverter circuit 60 is connected to a gate of the MOSFET 56 and an input of the inverter circuit 62. An output of the inverter circuit 62 is connected to a gate of the MOSFET 58. The step-down converter circuit 64 has the function of decreasing the power supply voltage VCC at the VCC terminal. When the short-circuit current detection circuit 51 detects a short-circuit current, the timer circuit 66 outputs a time setting signal which sets a time taken for the control power source voltage variable circuit 54 to decrease a control power source voltage Vcc from a voltage approximately equal to the power supply voltage VCC to a voltage outputted by the step-down converter circuit 64. The time setting signal sets a determined pulse width tPW longer than a period from the time when the short-circuit current detection circuit 51 detects a short-circuit current and a decrease in the gate voltage Vg begins to the time when the gate voltage Vg or the sense voltage Vs at the time of detecting a short-circuit current again becomes zero. When the short-circuit current detection circuit 51 does not detect a short circuit, the timer circuit 66 outputs an H-level signal. The timer circuit 66 outputs a low (L)-level time setting signal for a period corresponding to the pulse width tPW after the short-circuit current detection circuit 51 detects a short circuit.

When the short-circuit current detection circuit 51 does not detect a short circuit, the MOSFET 56 is in an on state and the MOSFET 58 is in an off state. As a result, the control power source voltage variable circuit 54 outputs the power supply voltage VCC at the VCC terminal as a control power source voltage Vcc. When the short-circuit current detection circuit 51 detects a short circuit, the MOSFET 56 is in an off state and the MOSFET 58 is in an on state, for a period corresponding to the pulse width tPW set by the timer circuit 66. Accordingly, the control power source voltage variable circuit 54 outputs as a control power source voltage Vcc for the period corresponding to the pulse width tPW a voltage obtained by decreasing the power supply voltage VCC by the step-down converter circuit 64.

Furthermore, the control IC 20 includes a power supply voltage decrease detection protection circuit 68. The power supply voltage decrease detection protection circuit 68 includes resistors 70, 72, and 74, switches 76 and 78, a comparator 80, a reference voltage source 82, and a delay circuit 84.

One terminal of the resistor 70 is connected to the VCC terminal and the other terminal of the resistor 70 is connected to one terminal of the resistor 72. The other terminal of the resistor 72 is connected to one terminal of the resistor 74 and the other terminal of the resistor 74 is connected to the ground. A common connection point of the resistors 70 and 72 is connected to an inverting input terminal of the comparator 80 via the switch 76 and a common connection point of the resistors 72 and 74 is connected to the inverting input terminal of the comparator 80 via the switch 78. A non-inverting input terminal of the comparator 80 is connected to a positive electrode terminal of the reference voltage source 82 and a negative electrode terminal of the reference voltage source 82 is connected to the ground. An output terminal of the comparator 80 is connected to an input of the delay circuit 84 and an output of the delay circuit 84 is connected to control terminals of the switches 76 and 78 and a third input of the OR circuit 44. A voltage of the reference voltage source 82 is set to a value at which a circuit inside the control IC 20 does not normally operate due to a decrease in the power supply voltage VCC at the VCC terminal.

When a voltage obtained by dividing the power supply voltage VCC supplied from the outside by the resistors 70, 72, and 74 falls below the voltage of the reference voltage source 82, the comparator 80 of the power supply voltage decrease detection protection circuit 68 outputs an H-level signal. If a time for which the comparator 80 outputs the H-level signal exceeds a time set by the delay circuit 84, then the delay circuit 84 outputs an H-level signal. This H-level signal switches the switches 76 and 78 and switches a voltage inputted to the comparator 80 to a voltage obtained by further dividing the voltage inputted to the comparator 80. As a result, the power supply voltage decrease detection protection circuit 68 detects a decrease in the power supply voltage VCC. The power supply voltage decrease detection protection circuit 68 has a hysteresis characteristic which is such that if that state continues for a determined time, that state is kept.

The operation of the control IC 20 will now be described. If an input signal for turning on or off the IGBT 10 is inputted at normal operation time to the IN terminal, then the input signal is inputted via the input signal detection circuit 22 and the predriver 24 to the IGBT drive circuit 26. When the IGBT drive circuit 26 turns on the IGBT 10, the IGBT drive circuit 26 outputs a source current for charging the gate capacitor of the IGBT 10. When the IGBT drive circuit 26 turns off (shuts down) the IGBT 10, the IGBT drive circuit 26 outputs a gate voltage Vg which is such that electric charges stored in the gate capacitor of the IGBT 10 are extracted.

A case where when the IGBT 10 is in an on state, an overcurrent flows through the IGBT 10 will now be described. If a sense voltage Vs corresponding to a sense current exceeds the overcurrent detection threshold of the reference voltage source 40, then the overcurrent detection comparator 38 outputs an H-level overcurrent detection signal. If overcurrent detection continues for a time longer than delay time set by the delay circuit 42, then the delay circuit 42 outputs an H-level signal. This H-level signal is inputted via the OR circuit 44 to the predriver 24 and the alarm output circuit 46. The predriver 24 gives the soft shutdown circuit 28 instructions to extract electric charges stored in the gate capacitor of the IGBT 10 by utilizing extracting capability smaller than that of the IGBT drive circuit 26 and gradually shut down the IGBT 10. If the alarm output circuit 46 receives from the OR circuit 44 notice of the occurrence of an abnormality, then the alarm output circuit 46 gives the outside notice of the occurrence of the abnormality via the AE terminal.

A case where when the IGBT 10 is in an on state, a short-circuit current flows through the IGBT 10 will now be described by reference to FIG. 2. FIG. 2 illustrates a divided voltage Vsc of a sense voltage Vs, a control power source voltage Vcc outputted by the control power source voltage variable circuit 54, a gate voltage Vg, and a collector current Ic from the top.

First, the IGBT drive circuit 26 outputs at time t0 a signal for turning on the IGBT 10. A gate voltage Vg gradually rises. When the gate voltage Vg exceeds an on-state threshold Vonth of the IGBT 10, a collector current Ic begins to flow and a divided voltage Vsc of a sense voltage Vs rises.

If the divided voltage Vsc exceeds the short-circuit detection threshold Vscth, then the short-circuit detection comparator 48 outputs an H-level short-circuit current detection signal. First, the predriver 24 is informed of the short-circuit current detection signal. The NLU circuit 30 is made to operate, and outputs a gate voltage Vg which is such that a short-circuit current is restrained.

On the other hand, the timer circuit 66 outputs an H-level time setting signal when the control IC 20 normally operates. At this time, the inverter circuit 60 and the inverter circuit 62 of the control power source voltage variable circuit 54 output an L-level signal and an H-level signal, respectively. Accordingly, the MOSFET 56 is in an on state and the MOSFET 58 is in an off state. As a result, the control power source voltage variable circuit 54 outputs the power supply voltage VCC inputted as a control power source voltage Vcc.

When the timer circuit 66 receives the short-circuit current detection signal from the short-circuit detection comparator 48, the timer circuit 66 outputs an L-level time setting signal for a period corresponding to the pulse width tPW. At this time, the inverter circuit 60 and the inverter circuit 62 of the control power source voltage variable circuit 54 output an H-level signal and an L-level signal, respectively. Accordingly, the MOSFET 56 is in an off state and the MOSFET 58 is in an on state. As a result, the control power source voltage variable circuit 54 outputs as a control power source voltage Vcc a voltage obtained by decreasing the power supply voltage VCC to a stepped-down level by the step-down converter circuit 64.

Accordingly, in a state in which a control power source voltage Vcc is decreased to the stepped-down level, the following malfunction may occur. A sudden shutdown of a high current value or high-level noise mixing occurs, at time t1 a high gate voltage Vg is inputted, and a short-circuit current flows again like the collector current Ic. Even in this case, the control IC 20 tries to perform the same behavior that it performed from the time t0 on.

At this time, a control power source voltage Vcc is decreased to the stepped-down level. Accordingly, the gate voltage Vg is decreased from a charging voltage Vgch1 at on time to a charging voltage Vgch2. As a result, the gate voltage Vg is decreased from the low charging voltage Vgch2 in a short period of time. This enables stable protective operation. Furthermore, a peak current IcP1 of the collector current Ic is decreased to a peak current IcP2.

If a short-circuit detection state continues after that for a period longer than delay time tdASC set by the delay circuit 52, then the delay circuit 52 outputs an H-level signal. This signal is inputted via the OR circuit 44 to the predriver 24 and the alarm output circuit 46. The predriver 24 gives the soft shutdown circuit 28 instructions to perform a soft shutdown. The alarm output circuit 46 gives the outside notice of the occurrence of an abnormality via the AE terminal.

With a soft shutdown by the soft shutdown circuit 28, the gate voltage Vg gradually decreases from a gate voltage VgNLU kept by the NLU circuit 30 and the IGBT 10 is gradually shut down.

With the control power source voltage variable circuit 54, the stepped-down level to which a control power source voltage Vcc is decreased by the step-down converter circuit 64 is set so as to be higher than a protection threshold set by the reference voltage source 82 of the power supply voltage decrease detection protection circuit 68. However, the stepped-down level to which a control power source voltage Vcc is decreased by the step-down converter circuit 64 may be set to a value lower than or equal to the protection threshold set by the reference voltage source 82. In this case, when the effect of a decrease in the gate voltage Vg to the charging voltage Vgch2 caused by decreasing a control power source voltage Vcc does not prevent a short circuit from occurring again, short-circuit protection is reliably realized by the power supply voltage decrease detection protection circuit 68.

An aspect of the drive device for the voltage-controlled semiconductor element according to the present disclosure has been described on the basis of the embodiment. However, the above description is a simple example and the drive device for the voltage-controlled semiconductor element according to the present disclosure is not limited to the above description.

With the drive device for the voltage-controlled semiconductor element having the above structure, a continuous short circuit caused by a malfunction is suppressed and a short-circuit peak current flowing at that time is suppressed.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A drive device for a voltage-controlled semiconductor element, the drive device comprising:
   a short-circuit current detection circuit which detects a short-circuit current flowing through the voltage-controlled semiconductor element;
   a timer circuit which outputs a time setting signal indicative of a determined time, responsive to the short-circuit current detection circuit detecting the short-circuit current; and
   a control power source voltage variable circuit which
      receives a power supply voltage applied to the drive device,
      decreases the power supply voltage for a period for which the control power source voltage variable circuit receives the time setting signal from the timer circuit, to thereby obtain a stepped-down voltage, and
      outputs the stepped-down voltage as a control power source voltage.

2. The drive device for the voltage-controlled semiconductor element according to claim 1, wherein the control power source voltage variable circuit includes:

a first switching element which, when the control power source voltage variable circuit does not receive the time setting signal from the timer circuit, is turned on to output the power supply voltage as the control power source voltage, and which is turned off when the control power source voltage variable circuit receives the time setting signal from the timer circuit;

a second switching element which is turned off when the control power source voltage variable circuit does not receive the time setting signal from the timer circuit, and which is turned on when the control power source voltage variable circuit receives the time setting signal from the timer circuit; and a step-down converter circuit which decreases the power supply voltage when the second switching element is turned on.

3. The drive device for the voltage-controlled semiconductor element according to claim 1, wherein the time setting signal outputted by the timer circuit sets a time that is longer than a period from a time when the short-circuit current detection circuit detects the short-circuit current and a gate voltage of the voltage-controlled semiconductor element begins to decrease to a time when the gate voltage of the voltage-controlled semiconductor element, at the time of the short-circuit current detection circuit detecting a short-circuit current, twice becomes zero.

4. The drive device for the voltage-controlled semiconductor element according to claim 1, further comprising:

a non-latch-up circuit, and a soft shutdown circuit, wherein:

when the short-circuit current detection circuit detects the short-circuit current, the short-circuit current detection circuit controls a gate voltage of the voltage-controlled semiconductor element so as to restrain the short-circuit current by the non-latch-up circuit; and the short-circuit current detection circuit gradually decreases the gate voltage by the soft shutdown circuit a pre-determined time after the short-circuit current detection circuit detects the short-circuit current.

5. The drive device for the voltage-controlled semiconductor element according to claim 1, further comprising a power supply voltage decrease detection protection circuit which detects a decrease in the power supply voltage, and which outputs a signal for gradually decreasing a gate voltage of the voltage-controlled semiconductor element.

6. The drive device for the voltage-controlled semiconductor element according to claim 5, wherein the control power source voltage variable circuit sets a level of the stepped-down voltage to a value smaller than or equal to a threshold, by which the power supply voltage decrease detection protection circuit detects the decrease in the power supply voltage.

\* \* \* \* \*